(12) United States Patent
Ito

(10) Patent No.: US 10,944,230 B2
(45) Date of Patent: Mar. 9, 2021

(54) CIRCUIT BOARD CONNECTOR

(71) Applicant: Sumitomo Wiring Systems, Ltd., Mie (JP)

(72) Inventor: Yui Ito, Mie (JP)

(73) Assignee: Sumitomo Wiring Systems, Ltd.

( * ) Notice: Subject to any disclaimer, the term of this patent is extended or adjusted under 35 U.S.C. 154(b) by 0 days.

(21) Appl. No.: 16/734,198

(22) Filed: Jan. 3, 2020

(65) Prior Publication Data

US 2020/0266598 A1 Aug. 20, 2020

(30) Foreign Application Priority Data

Feb. 15, 2019 (JP) .............................. JP2019-025758

(51) Int. Cl.
| | |
|---|---|
| *H01R 9/05* | (2006.01) |
| *H01R 43/24* | (2006.01) |
| *H01R 24/00* | (2011.01) |
| *H01R 43/18* | (2006.01) |
| *H05K 5/00* | (2006.01) |
| *H01R 4/02* | (2006.01) |
| *H05K 3/32* | (2006.01) |
| *H01R 13/405* | (2006.01) |

(52) U.S. Cl.
CPC ............ *H01R 43/24* (2013.01); *H01R 4/029* (2013.01); *H01R 13/405* (2013.01); *H01R 24/00* (2013.01); *H01R 43/18* (2013.01); *H05K 3/328* (2013.01); *H05K 5/0026* (2013.01)

(58) Field of Classification Search
CPC .... H01R 17/125; H01R 13/658; H01R 17/12; H01R 24/50
USPC ................................... 439/579, 63, 578, 581
See application file for complete search history.

(56) References Cited

U.S. PATENT DOCUMENTS

2018/0354434 A1* 12/2018 Kaneko ................ H05K 5/0069

FOREIGN PATENT DOCUMENTS

JP 2004-127571 4/2004

* cited by examiner

*Primary Examiner* — Phuong Chi Thi Nguyen
(74) *Attorney, Agent, or Firm* — Gerald E. Hespos; Michael J. Porco; Matthew T. Hespos

(57) ABSTRACT

It is aimed to provide a circuit board connector and a circuit board connector manufacturing method capable of enabling molding by a small-size molding apparatus by performing insert molding in three stages. A circuit board connector (1) includes a case resin portion 2, a connector resin portion 3 having a base (31) and a tower (32) and connector terminals (6A, 6B and 6C). The connector resin portion (3) includes core resin portions (4A, 4B and 4C) for covering intermediate parts (63) of the connector terminals (6A, 6B and 6C) and an outer resin portion (5) for covering the core resin portions (4A, 4B and 4C). A resin material constituting the case resin portion (2) is joined to a resin material constituting the outer resin portion (5) by resin molding.

9 Claims, 13 Drawing Sheets

CIRCUIT BOARD CONNECTOR

BACKGROUND

Field of the Invention

The disclosure relates to a circuit board connector having a part in which a circuit board is arranged.

Related Art

Connectors are used for wiring various electronic control components in control devices. Further, a circuit board of a first control device may be arranged in a case of a machine component that has various electronic control components, and a connector for wiring this circuit board to a second control device may be provided in the case. In this situation, the connector is a circuit board connector and is provided in the case that has the circuit board arranged therein.

Japanese Unexamined Patent Publication No. 2004-127571 discloses a molding structure for a case with connector. The case includes a case body and a housing penetrates through a side wall of the case body. Terminal fittings project into the case body from the housing. The housing has a connector portion that is connectable to a mating connector, and a circuit board in the case body is to be connected to the terminal fittings.

The case body is molded by arranging the housing and the terminal fittings as cores in a mold and performing insert molding. The case with connector disclosed in Japanese Unexamined Patent Publication No. 2004-127571 can be molded by a simple mold rather than a slide mold even if the case with connector includes the terminal fittings that form an undercut shape.

A conventional case with connector disclosed in Japanese Unexamined Patent Publication No. 2004-127571 is formed by insert-molding a housing in a first stage in which terminal fittings are arranged in a mold, and then insert-molding a case body in a second stage in which the housing is arranged in a mold. However, insert molding in the second stage may be difficult to perform with a general small molding apparatus depending on the arrangement of the terminal fittings and the configuration of a molded article, such as a formation direction of a housing that includes a connector portion. Thus, further ingenuity is necessary to enable small molding apparatus to mold circuit board connectors or cases with connectors.

The present disclosure was developed in view of such a problem and aims to provide a circuit board connector capable of enabling molding by a small molding apparatus by performing insert molding in three stages.

SUMMARY

A first aspect of the disclosure is directed to a circuit board connector with a case resin portion having a circuit board arranged therein, a connector resin portion including a base constituting a part of the case resin portion and a tower connected to the base and projecting from the case resin portion. Connector terminals are provided in the connector resin portion to connect the circuit board to electrically outside. The connector resin portion includes one or more core resin portions arranged in an inner part of the connector resin portion to cover intermediate parts of the connector terminals excluding both end parts and an outer resin portion arranged in an outer part of the connector resin portion to cover the core resin portion. A resin material constituting the case resin portion is joined to a resin material constituting the outer resin portion by resin molding.

The circuit board connector of the first aspect is molded by performing: molding in a first stage for the core resin portion having the connector terminals arranged therein; molding in a second stage for the outer resin portion having the core resin portion arranged therein; and molding in a third stage for the case resin portion having the connector resin portion arranged therein. A degree of freedom in arraying the terminals can be enhanced by molding the core resin portion having the terminals arranged therein. For example, the connector terminals can be arrayed separately in plural core resin portions. In this case, the core resin portion is formed for each stage in which the connector terminals are arranged and the entire array of the connector terminals can be formed by uniting the core resin portions.

The structure of a molding apparatus can be simplified by molding the connector resin portion having one or more core resin portions arranged therein, as compared to molding the connector resin portion and the case resin portion integrally. Specifically, the connector resin portion includes a part projecting from the case resin portion. When integrally molding the connector resin portion and the case resin portion, the outer shape of a molded article is large and a molding apparatus that molds the molded article and from which the molded article is taken out may be enlarged. On the other hand, when separately molding the connector resin portion and the case resin portion, a molding apparatus merely is dimensioned in conformity with the outer shape of the connector resin portion and in conformity with the outer shape of the case resin portion. Thus, the molding apparatus can be reduced in size.

The case resin portion is insert-molded in the mold having the connector resin portion arranged therein, and the resin material constituting the case resin portion is joined to the resin material constituting the outer resin portion of the connector resin portion by resin molding. In this way, the circuit board connector of the one aspect can be molded by the small molding apparatus by performing insert molding in three stages for the core resin portion, for the outer resin portion and for the case resin portion.

Therefore, according to the circuit board connector of the first aspect, molding by the small molding apparatus is possible by performing insert molding in three stages.

A second aspect of the disclosure is directed to a method for manufacturing a circuit board connector that includes: a case resin portion having a circuit board arranged therein; a connector resin portion including a base of the case resin portion; and a tower connected to the base and projecting from the case resin portion. Connector terminals are provided in the connector resin portion and electrically connect the circuit board to outside. The connector resin portion includes one or more core resin portions arranged in an inner part of the connector resin portion to cover intermediate parts of the connector terminals excluding both end parts, and an outer resin portion is arranged in an outer part of the connector resin portion to cover the core resin portion. A resin material constituting the case resin portion is joined to a resin material constituting the outer resin portion by resin molding. The method includes at least first, second and third molding steps. The first molding step includes obtaining a first insert part by filling a first resin material for constituting the core resin portion into a first mold having the connector terminals arranged therein and performing insert molding for the core resin portion. The second molding step includes obtaining a second insert part by filling a second resin material for constituting the outer resin portion into a second mold having the first insert part arranged therein and performing insert molding for the outer resin portion. The third molding step includes obtaining the circuit board connector by filling a third resin material for constituting the case resin portion into a third mold having the second insert part arranged therein and performing insert molding for the case resin portion.

The method for manufacturing a circuit board connector of the second aspect of the disclosure includes molding the circuit board connector by performing insert molding in three stages as the first to third molding steps. Particularly, as the second and third molding steps, the outer resin portion of the connector resin portion is molded separately from the case resin portion before the case resin portion is molded. Thus, even the circuit board connector in which the connector resin portion projects long from the case resin portion can be molded by a small molding apparatus.

DETAILED DESCRIPTION

Preferred embodiments of the aforementioned circuit board connector and circuit board connector manufacturing method are described with reference to the drawings.

Figure 1:
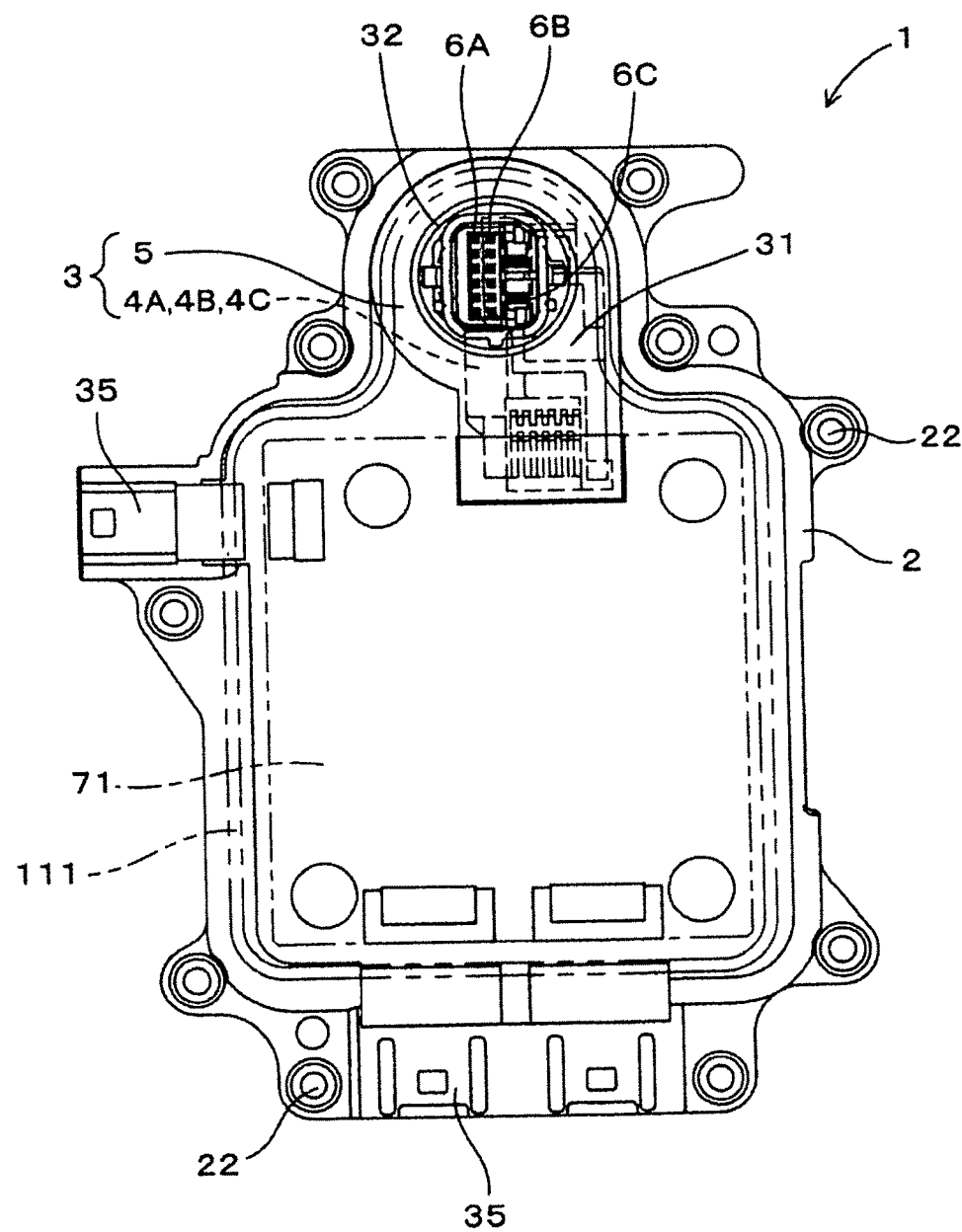
FIG. 1 is a plan view showing a circuit board connector according to an embodiment.
Figure 2:
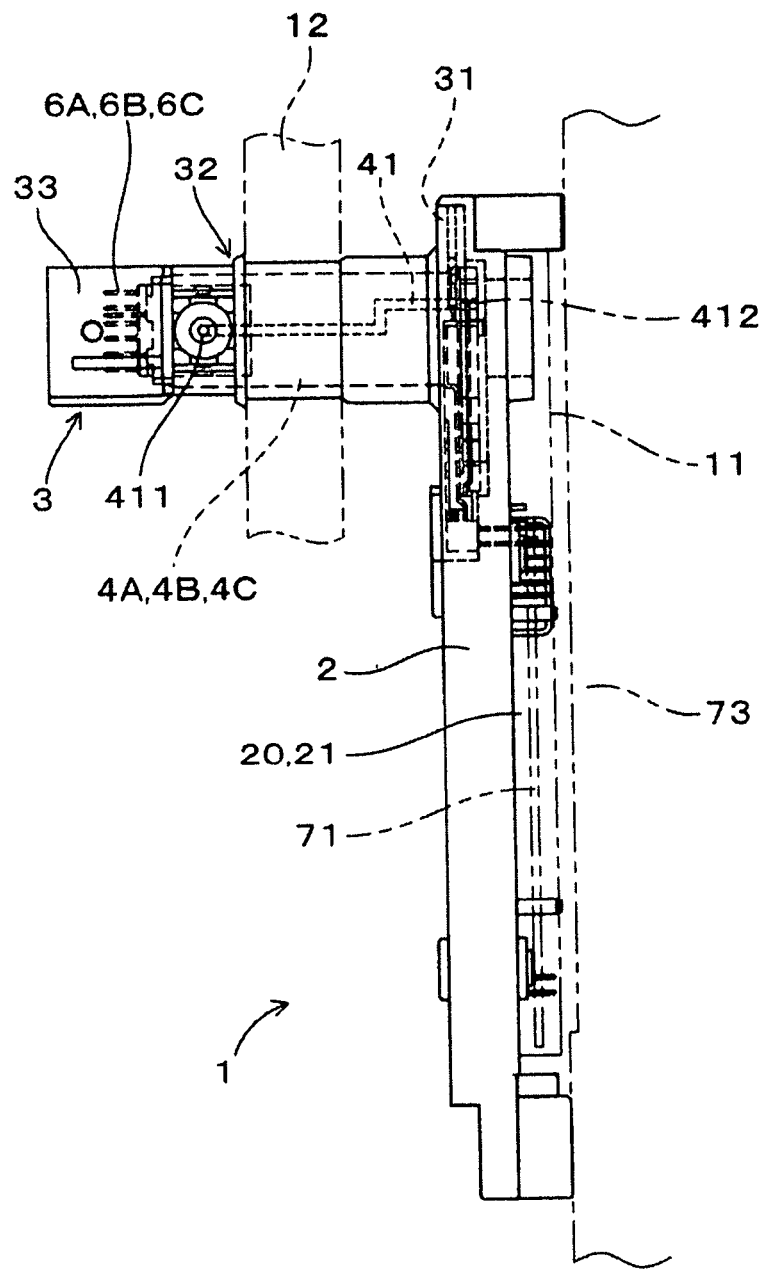
FIG. 2 is a side view showing the circuit board connector.
Figure 3:
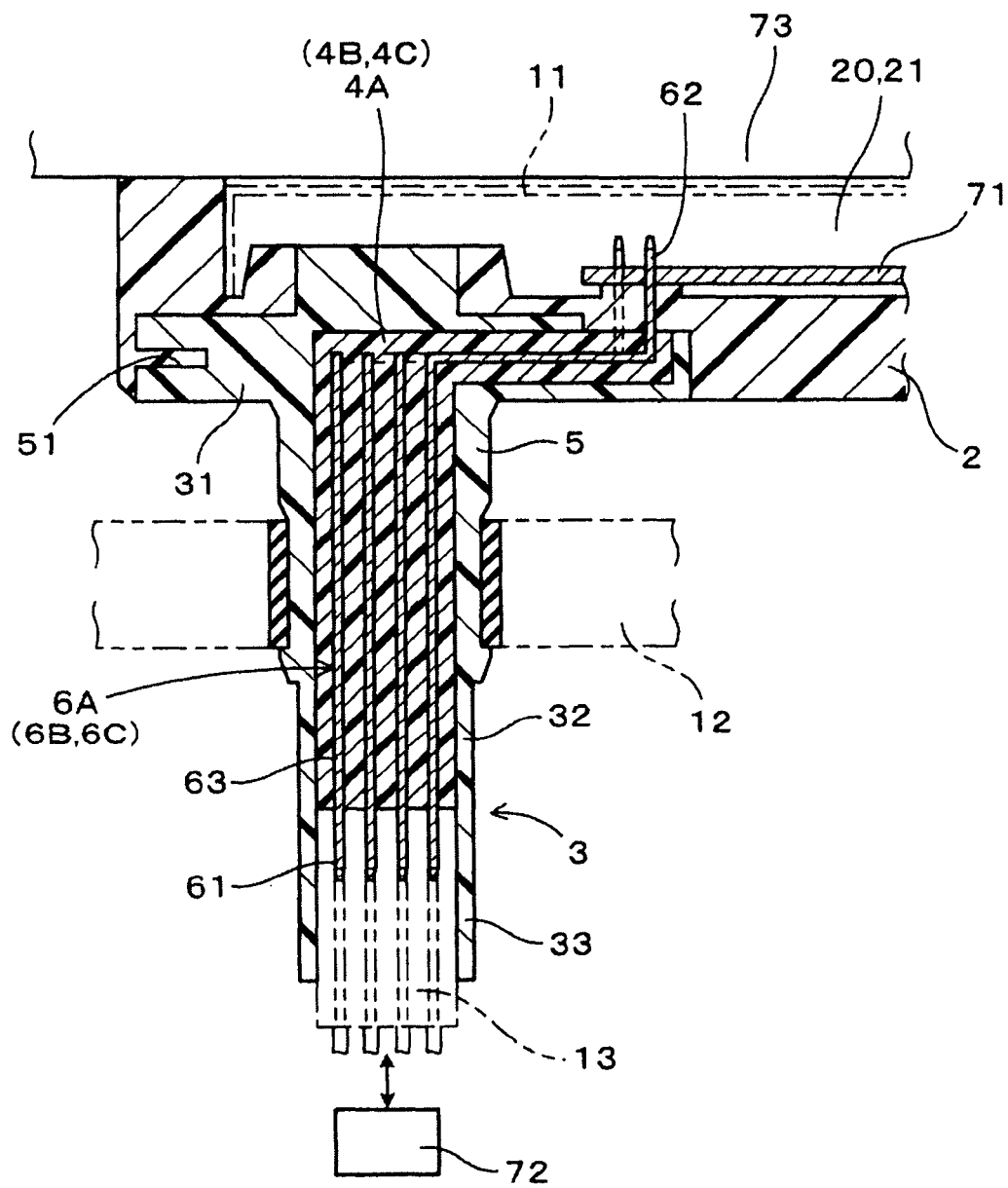
FIG. 3 is a section schematically showing the circuit board connector.

A circuit board connector 1 of this embodiment includes a case resin portion 2, a connector resin portion 3 and connector terminals 6A, 6B, 6C, as shown in FIGS. 1 to 3. A circuit board 71 for controlling electronic control components 72 is arranged in the case resin portion 2. The connector resin portion 3 includes a base 31 constituting a part of the case resin portion 2 and a tower 32 connected to the base 31 and projecting from the case resin portion 2. The connector terminals 6A, 6B and 6C are provided in the connector resin portion 3 to connect the circuit board 71 electrically to outside.

The connector resin portion 3 includes core resin portions 4A, 4B and 4C and an outer resin portion 5 covering the core resin portions 4A, 4B and 4C. The core resin portions 4A, 4B and 4C are arranged in an inner part of the connector resin portion 3 and cover intermediate parts 63 of the connector terminals 6A, 6B and 6C excluding both end parts 61, 62. The outer resin portion 5 is arranged in an outer part of the connector resin portion 3. A resin material constituting the case resin portion 2 is joined to a resin material constituting the outer resin portion 5 by resin molding.

(Circuit Board Connector 1)

As shown in FIGS. 1 to 3, the circuit board connector 1 is formed as a case to be mounted on an automatic transmission 73 serving as a machine component. The automatic transmission 73 is installed in a vehicle. The circuit board 71 arranged in the case resin portion 2 of the circuit board connector 1 controls various electronic control components 72 in the automatic transmission 73. These electronic control components 72 include various actuators, sensors and the like.

The circuit board connector 1 is such that a connector is provided in a case to be mounted on the automatic transmission 73 and can be called a case with connector. The case resin portion 2 is mounted on a case part in the automatic transmission 73.

The circuit board connector 1 electrically connects the circuit board 71 for controlling the operation of various electronic control devices to a control device such as an electronic control unit (ECU) located outside the circuit board connector 1. Note that the machine component may be any of various components other than the automatic transmission 73. Oil (automatic transmission oil) for an automatic shift control operation and lubrication between constituent components is used in the automatic transmission 73.

(Case Resin Portion 2)

As shown in FIGS. 1 to 3, the case resin portion 2 has a recess 21 for arranging the circuit board 71 inside. The case resin portion 2 is a nearly flat plate in conformity with the shape of the flat plate-like circuit board 71. The case resin portion 2 also is formed with a connector 35 in which other terminals are arranged, besides the connector resin portion 3. A cover 11 for accommodating and sealing the circuit board 71 in the recess 21 is mounted on the case resin portion 2 via a seal 111. A space 20 accommodating the circuit board 71 is formed between the case resin portion 2 and the cover 11. The seal 111 between the case resin portion 2 and the cover 11 prevents the oil in the automatic transmission 73 from intruding into the space 20.

The case resin portion 2 is formed with mounting holes 22 for mounting the case resin portion 2 on the automatic transmission 73 and mounting holes 22 for mounting the cover 11 on the case resin portion 2. Bolts are inserted into the mounting holes 22. In FIG. 1, several mounting holes 22 are used to mount the circuit board connector 1 on the automatic transmission 73, and the remaining mounting holes 22 are used to mount the cover 11 on the circuit board connector 1.

(Connector Resin Portion 3)

As shown in FIGS. 1 to 3, the connector resin portion 3 includes the base 31 arranged adjacent to the case resin portion 2 and the column-like tower 32 arranged perpendicular to the base 31 and the case resin portion 2. The tower 32 projects in a direction perpendicular to a plane direction of the circuit board 71 in the case resin portion 2. The tower 32 is longer than a length of the base 31 in the plane direction. The tower 32 is inserted into a case member 12 separate from the circuit board connector 1.

Figure 4:
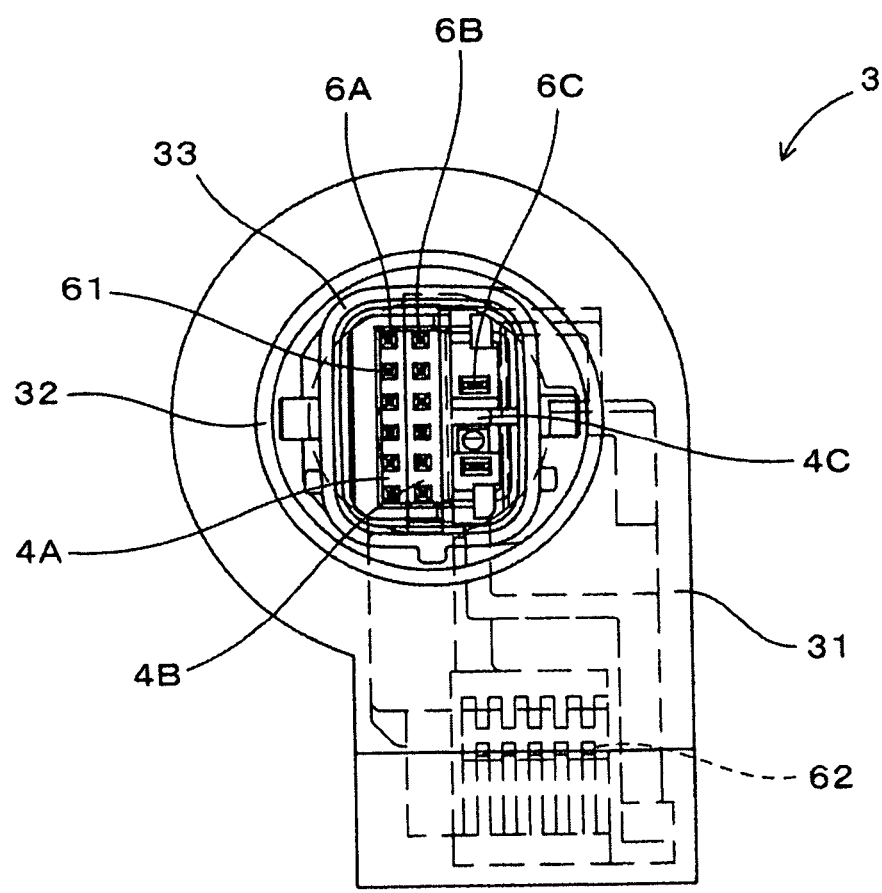
FIG. 4 is a plan view showing a connector resin portion according to the embodiment.
Figure 5:
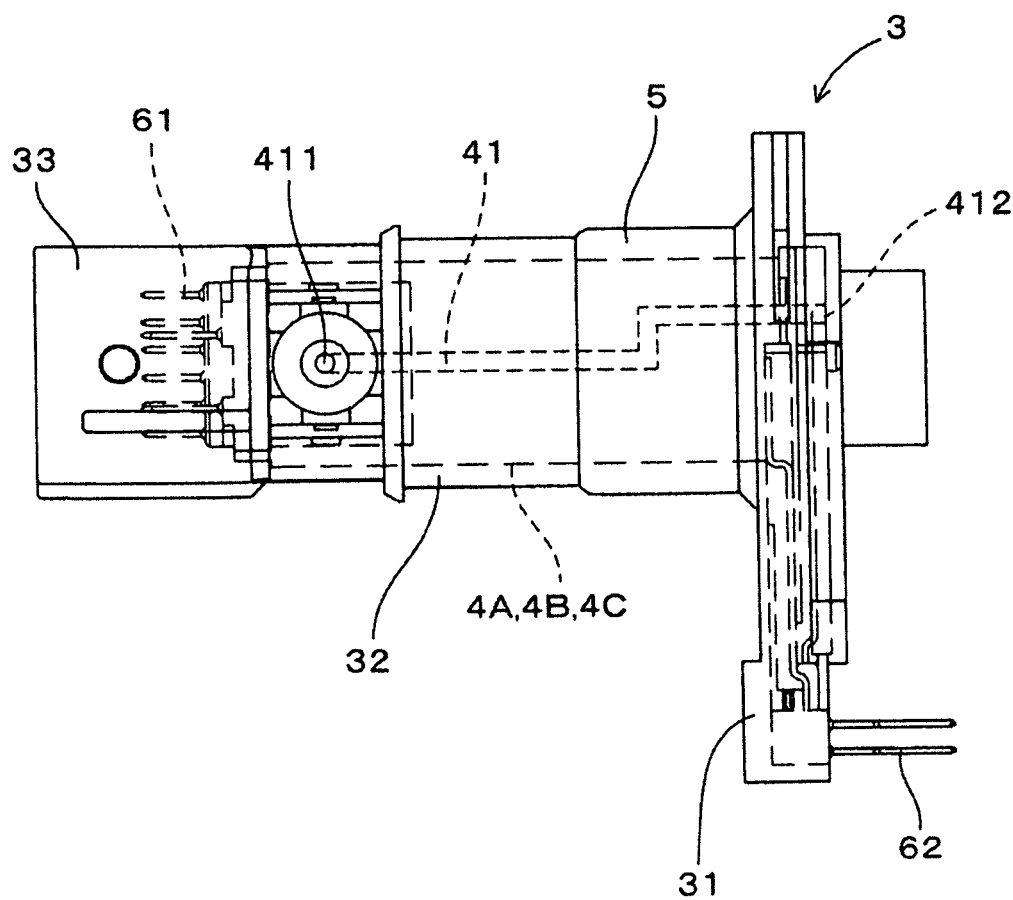
FIG. 5 is a side view showing the connector resin portion.
Figure 6:
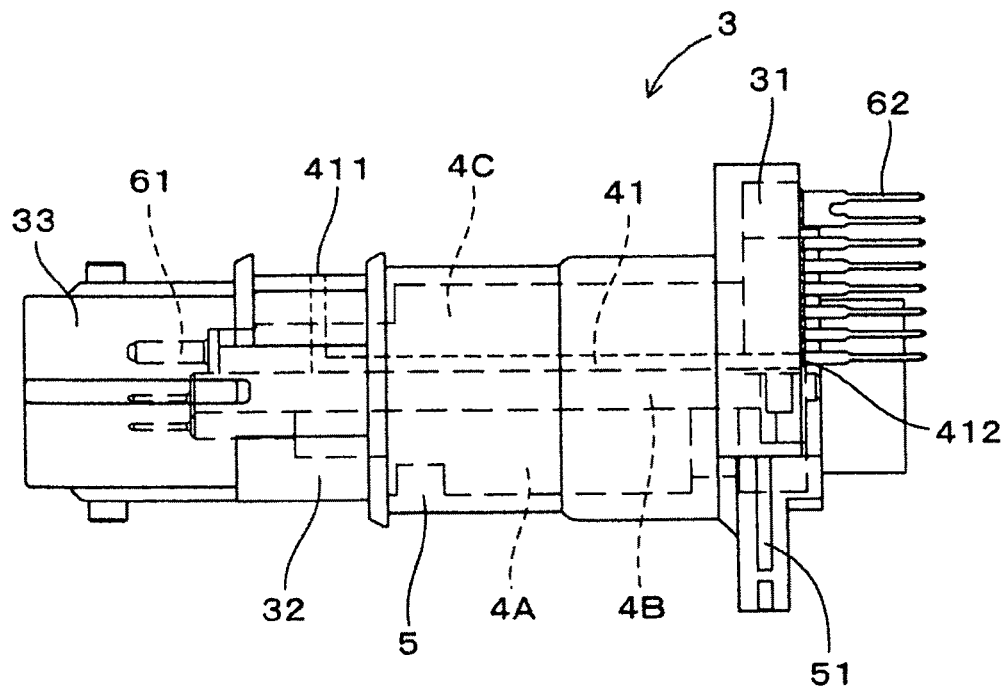
FIG. 6 is another side view showing the connector resin portion.

As shown in FIGS. 4 to 6, the connector resin portion 3 includes the connector terminals 6A, 6B and 6C. FIG. 4 shows the connector resin portion 3 viewed from a tip side of the tower 32. FIG. 5 shows the connector resin portion 3 viewed from an overlapping direction of the core resin portions 4A, 4B and 4C. FIG. 6 shows the connector resin portion 3 from a direction in which rows of the respective connector terminals 6A, 6B and 6C are arranged.

In the circuit board connector 1, parts of the plurality of connector terminals 6A, 6B and 6C arranged in the connector resin portion 3 are different from parts of the connector terminals 6A, 6B and 6C arranged in the case resin portion 2. The connector resin portion 3 is constituted by the core resin portions 4A, 4B and 4C and the outer resin portion 5. The core resin portions 4A, 4B and 4C are arranged in the inner part of the connector resin portion 3 and are provided around the connector terminals 6A, 6B and 6C. The outer resin portion 5 is arranged in the outer part of the connector resin portion 3 and is provided around the core resin portions 4A, 4B and 4C. The core resin portions 4A, 4B and 4C are mostly embedded in the outer resin portion 5. As shown in FIG. 3, a connector mounting portion 33 on which a mating connector 13 is mounted is formed on a tip of the connector resin portion 3.

The connector mounting portion 33 is formed by the outer resin portion 5 and forms tube surrounding a first end 61 of each of the connector terminals 6A, 6B and 6C projecting from the core resin portions 4A, 4B and 4C. Ends of the core resin portions 4A, 4B and 4C, from which the first end 61 of each of the connector terminals 6A, 6B and 6C projects, are exposed at an inner bottom position of the connector mounting portion 33.

(Connector Terminals 6A, 6B and 6C)

Figure 7:
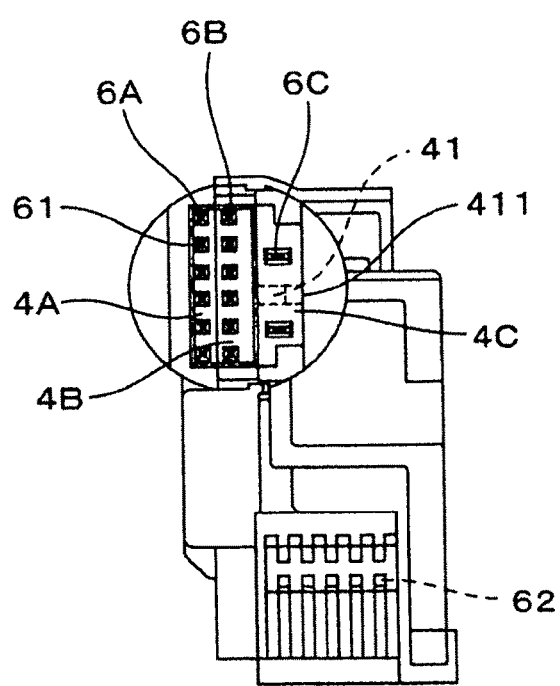
FIG. 7 is a plan view showing core resin portions according to the embodiment.
Figure 8:
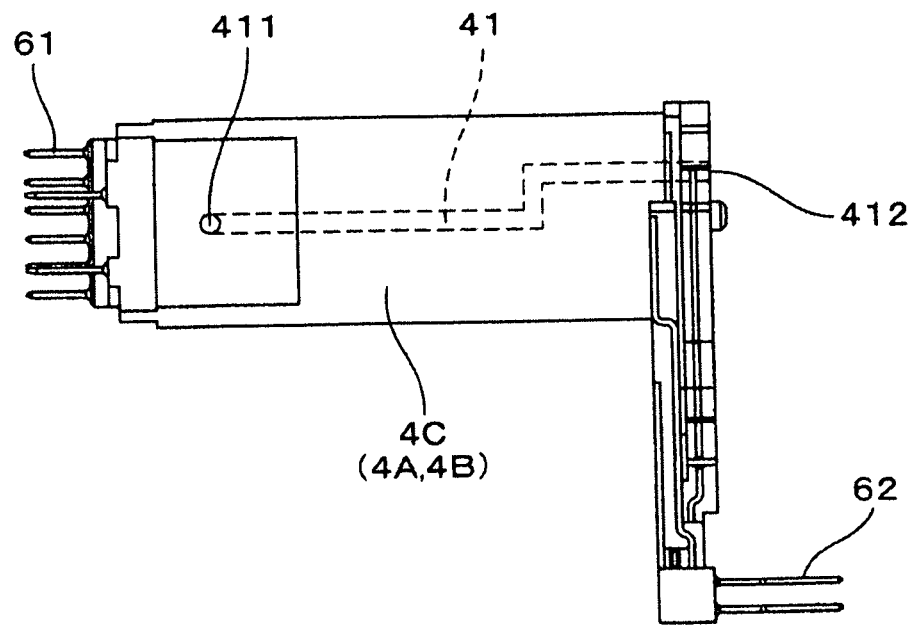
FIG. 8 is a side view showing the core resin portion according to the embodiment.
Figure 9:
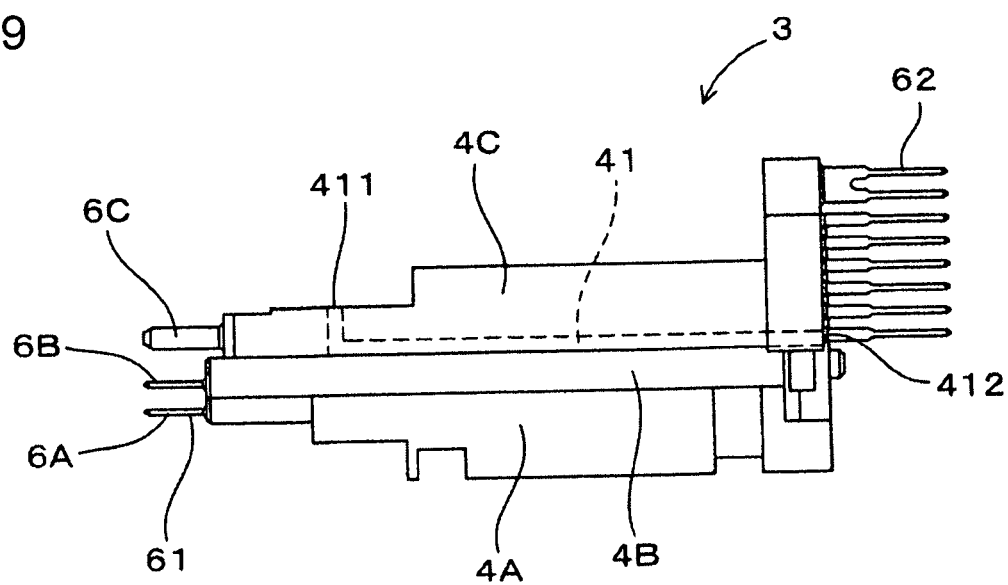
FIG. 9 is another side view showing the core resin portions.

As shown in FIGS. 7 to 9, the connector terminals 6A, 6B and 6C are formed by conductors. FIG. 7 shows the core resin portions 4A, 4B and 4C and the connector terminals 6A, 6B and 6C viewed from the tip side of the tower 32. FIG. 8 shows the core resin portions 4A, 4B and 4C and the connector terminals 6A, 6B and 6C viewed from the overlapping direction of the core resin portions 4A, 4B and 4C. FIG. 9 shows the core resin portions 4A, 4B and 4C and the connector terminals 6A, 6B and 6C viewed from the direction in which the rows of the connector terminals 6A, 6B and 6C are arranged.

The first ends 61 of the first connector terminals 6A are arranged side by side in a row in one direction to be parallel to each other. The first ends 61 of the second connector terminals 6B also are arranged side by side in a row in the one direction to be parallel to each other. The first ends 61 of the third connector terminals 6C also are arranged side by side in a row in the one direction to be parallel to each other.

As shown in FIG. 7, the first ends 61 of the first connector terminals 6A, the first ends 61 of the second connector terminals 6B and the first ends 61 of the third connector terminals 6C are arranged side by side in a plurality of stages in a direction perpendicular to the one direction. The first ends 61 of the connector terminals 6A, 6B and 6C arranged in the stages form the stage by the first ends 61 of the first connector terminals 6A, the stage by the first ends 61 of the second connector terminals 6B and the stage by the first ends 61 of the third connector terminals 6C.

The first and second connector terminals 6A, 6B are control connector terminals, and the third connector terminals 6C are power supply connector terminals. The first connector terminals 6A become an insert part to be arranged in a mold while being connected to each other by a carrier, and are arranged in the first core resin portion 4A by insert-molding the first core resin portion 4A. After the first core resin portion 4A is molded, the carrier in the first connector terminals 6A is removed to separate the connector terminals 6A. Note that the carrier is a part for preventing the first connector terminals 6A from being separated from each other when the first connector terminals 6A are formed by press working.

The second connector terminals 6B and the third connector terminals 6C also are arranged in the second or third core resin portion 4B or 4C in the same manner as the first connector terminals 6A.

The first ends 61 of the respective connector terminals 6A, 6B and 6C project from the end surfaces of the respective core resin portions 4A, 4B and 4C inside the connector mounting portion 33 of the connector resin portion 3 and are exposed to the outside of the connector resin portion 3. Second ends 62 of the respective connector terminals 6A, 6B and 6C project from the end surfaces of the respective core resin portions 4A, 4B and 4C in the recess 21 of the case resin portion 2 and are exposed in the recess 21. The connector terminals 6A, 6B and 6C are bent to reach a state parallel to a formation direction of the case resin portion 2 from a state parallel to a formation direction of the tower 32 and further bent to reach a state parallel to the formation direction of the tower 32.

(Core Resin Portions 4A, 4B and 4C)

As shown in FIGS. 7 to 9, the core resin portions 4A, 4B and 4C covering the intermediate parts 63 of the connector terminals 6A, 6B and 6C face each other in the outer resin portion 5. The core resin portions 4A, 4B and 4C of this embodiment are composed of the first core resin portion 4A having the first connector terminals 6A arranged therein, the second core resin portion 4B having the second connector terminals 6B arranged therein and the third core resin portion 4C having the third connector terminals 6C arranged therein.

The connector resin portion 3 is formed with a ventilation path 41 for letting the space 20 having the circuit board 71 arranged therein be open to outside air. The ventilation path 41 is open in a side surface of the outer resin portion 5 constituting the tower 32, utilizing a groove formed in mating surfaces of the core resin portions 4A, 4B and 4C facing each other. An outer opening 411 of the ventilation path 41 is open in the side surface of the outer resin portion 5 constituting the tower 32, and an inner opening 412 of the ventilation path 41 is open to the space 20.

The outer opening 411 is open in the side surface of the outer resin portion 5 except the connector mounting portion 33. The tower 32 of this embodiment is inserted into the case 12, and the ventilation path 41 is open to outside air by way of the inside of the case 12.

The groove forming the ventilation path 41 of this embodiment is formed in the mating surface of the third core resin portion 4C with the second core resin portion 4B. An outer end part of the ventilation path 41 is formed by a through hole provided in the core resin portion 4C and the outer resin portion 5 constituting the tower 32. The groove forming the ventilation path 41 may be formed in at least one of the mating surfaces of the respective core resin portions 4A, 4B and 4C.

The space 20 in the case resin portion 2 can be ventilated by air outside the circuit board connector 1 by forming the ventilation path 41. Even if the space 20 in the case resin portion 2 is heated by heat generation of the circuit board 71 and the like, the inside of the case resin portion 2 can be cooled by letting air in this space 20 escape to outside from the ventilation path 41.

As many core resin portions 4A, 4B and 4C as the stages in which the connector terminals 6A, 6B and 6C are arranged are formed. By molding the core resin portions 4A, 4B and 4C for each stage of the connector terminals 6A, 6B and 6C, the connector terminals 6A, 6B and 6C can be positioned easily with respect to the mold, and the core resin portions 4A, 4B and 4C having the connector terminals 6A, 6B and 6C arranged therein can be insert-molded easily. The core resin portions 4A, 4B and 4C face each other, thereby determining intervals between the adjacent ones of the stages of the connector terminals 6A, 6B and 6C.

(Outer Resin Portion 5)

As shown in FIGS. 7 to 9, the outer resin portion 5 forms the outer shape of the connector resin portion 3. A part where the case resin portion 2 and the outer resin portion 5 are joined is shaped to retain the outer resin portion 5 in the case resin portion 2. In this embodiment, a part of the outer resin portion 5 to be joined to the case resin portion 2 is formed with an inflow groove 51, into which a resin material for constituting the case resin portion 2 flows, by being indented in a direction perpendicular to the formation direction of the tower portion 32.

By the entrance of a part of the case resin portion 2 into the inflow groove 51, the separation of the connector resin portion 3 from the case resin portion 2 can be made difficult. Note that, instead of forming the inflow groove 51, a projection projecting in the direction perpendicular to the formation direction of the tower 32 may be formed on the part of the outer resin portion 5 to be joined to the case resin portion 2. Also in this case, functions and effects similar to those in the case of forming the inflow groove 51 are obtained.

(Resin Material)

The case resin portion 2, the core resin portions 4A, 4B and 4C and the outer resin portion 5 of the circuit board connector 1 of this embodiment are molded with thermoplastic resins having the same composition. Thus, after the circuit board connector 1 is molded, the case resin portion 2, the core resin portions 4A, 4B and 4C and the outer resin portion 5 are integrated.

If a cross-section obtained by cutting the circuit board connector 1 is observed, boundary positions between the case resin portion 2, the core resin portions 4A, 4B and 4C and the outer resin portion 5 can be confirmed. Surface layers of the resin formed when the respective resin portions 2, 4A, 4B, 4C and 5 are molded are arranged at these boundary positions. These surface layers often have properties such as a high hardness different from other parts. It can be confirmed by this that the case resin portion 2, the core resin portions 4A, 4B and 4C and the outer resin portion 5 were molded separately.

The connector resin portion 3 serves as an insert part in insert-molding the case resin portion 2. The molten resin material for constituting the case resin portion 2 flows to and is joined to the surface of the resin material constituting the outer resin portion 5 of the connector resin portion 3. Further, the resin material for constituting the case resin portion 2 also may be joined to the resin material constituting the respective core resin portions 4A, 4B and 4C.

(Molds 81, 82 and 83 and Molding Apparatus)

The circuit board connector 1 of this embodiment is molded by a molding apparatus for performing injection molding using molds 81, 82 and 83. The circuit board connector 1 is molded by performing insert molding in three stages. The molding apparatus is configured to make mold parts constituting the molds 81, 82 and 83 movable and to fill the resin material into cavities 810, 820 and 830 formed by the mold parts.

In the molding apparatus, the resin material is filled into the cavity 810, 820, 830 of the mold 81, 82, 83, and a molded article is taken out from the mold 81, 82, 83 after the resin material is cooled to mold the molded article. The molding apparatus can make a stroke (reciprocal movement) corresponding to the size of the molded article to enable the molded article to be taken out. The larger the molded article, the large the stroke necessary for the molding apparatus and the larger the molding apparatus.

(Method for Manufacturing Circuit Board Connector 1)

Next, a method for manufacturing the circuit board connector 1 is described in detail. In the method for manufacturing the circuit board connector 1, the circuit board connector 1 is molded by performing insert molding in three stages as first to third molding steps.

Figure 10:
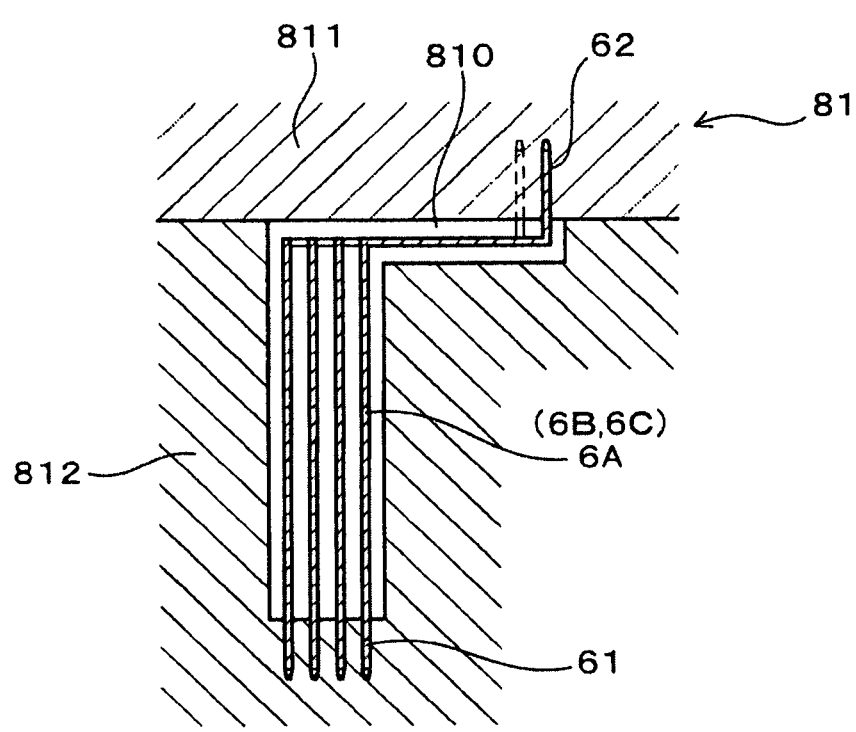
FIG. 10 is a section showing a method for manufacturing the circuit board connector according to the embodiment, schematically showing a state where connector terminals are arranged in a mold.

In the first molding step, the first connector terminals 6A are arranged in the cavity 810 of the first mold 81 as shown in FIG. 10. At this time, the connector terminals 6A are connected by the carrier, the intermediate parts 63 of the first connector terminals 6A are arranged in the cavity 810 of the first mold 81, and the end parts 61, 62 of the first connector terminals 6A are arranged outside the cavity 810 of the first mold 81.

Figure 11:
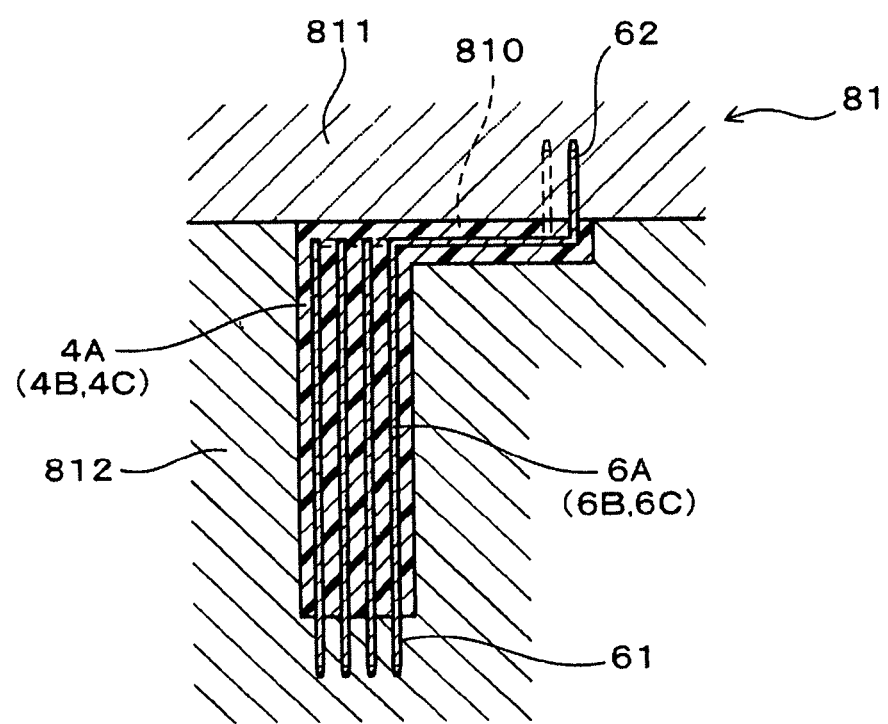
FIG. 11 is a section showing the method for manufacturing the circuit board connector according to the embodiment, schematically showing a state where the core resin portions are molded in the mold.

Then, as shown in FIG. 11, a first resin in a molten state for constituting the first core resin portion 4A is filled into the cavity 810 of the first mold 81. Thus, the first core resin portion 4A is molded with the first resin material, the intermediate parts 63 of the first connector terminals 6A are embedded in the first core resin portion 4A, and the end parts 61, 62 of the first connector terminals 6A project from both ends of the first core resin portion 4A. In this way, the first core resin portion 4A having the first connector terminals 6A arranged therein is insert-molded to mold a first insert part 40. After the molding of the first insert part 40, the carrier in the first connector terminals 6A is cut off to separate the first connector terminals 6A.

Also for the second and third core resin portions 4B, 4C, the first resin material is filled into the cavity 810 of the first mold 81 to mold the first insert part 40 as in the case of the first core resin portion 4A.

The first mold 81 can be constituted by two openable and closable mold parts 811, 812 for molding the respective core resin portions 4A, 4B and 4C.

Figure 12:
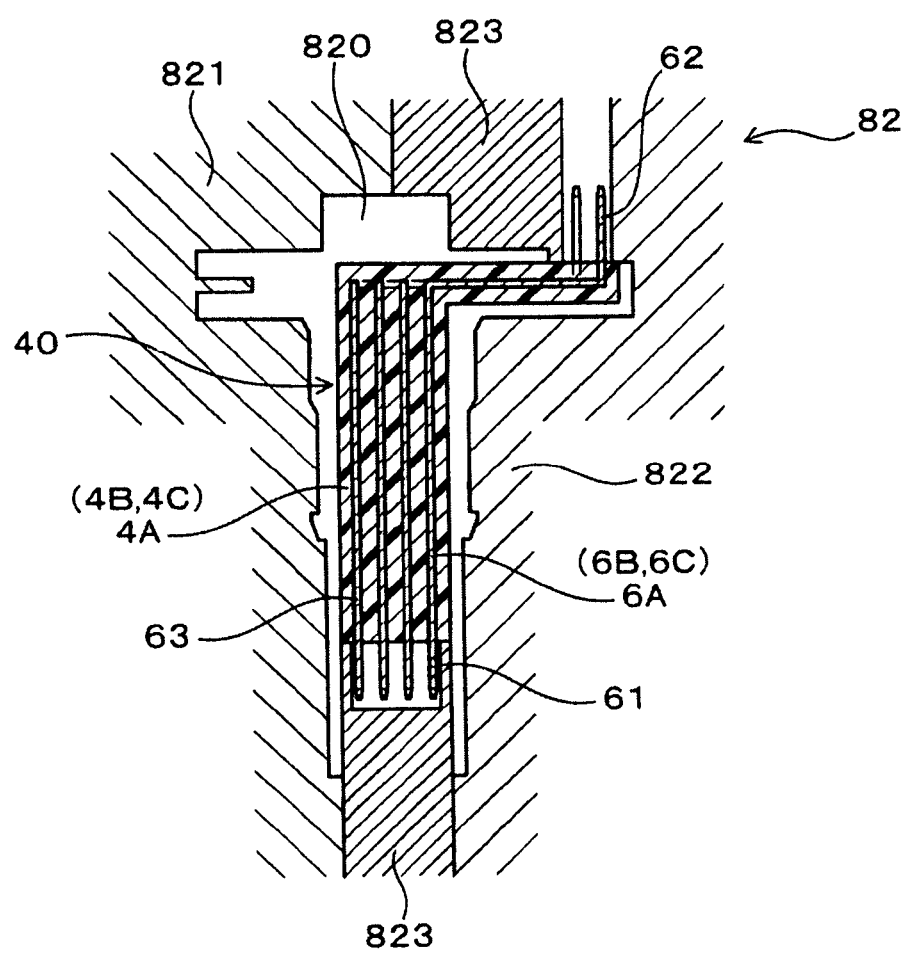
FIG. 12 is a section showing the method for manufacturing the circuit board connector according to the embodiment, schematically showing a state where an insert part including the core resin portions is arranged in a mold.

Subsequently, in the second molding step, the first to third core resin portions 4A, 4B and 4C serving as the first insert part 4 are arranged in the cavity 820 of the second mold 82, as shown in FIG. 12. At this time, both end parts 61, 62 of the connector terminals 6A, 6B and 6C are arranged outside the cavity 820 of the second mold 82.

Figure 13:
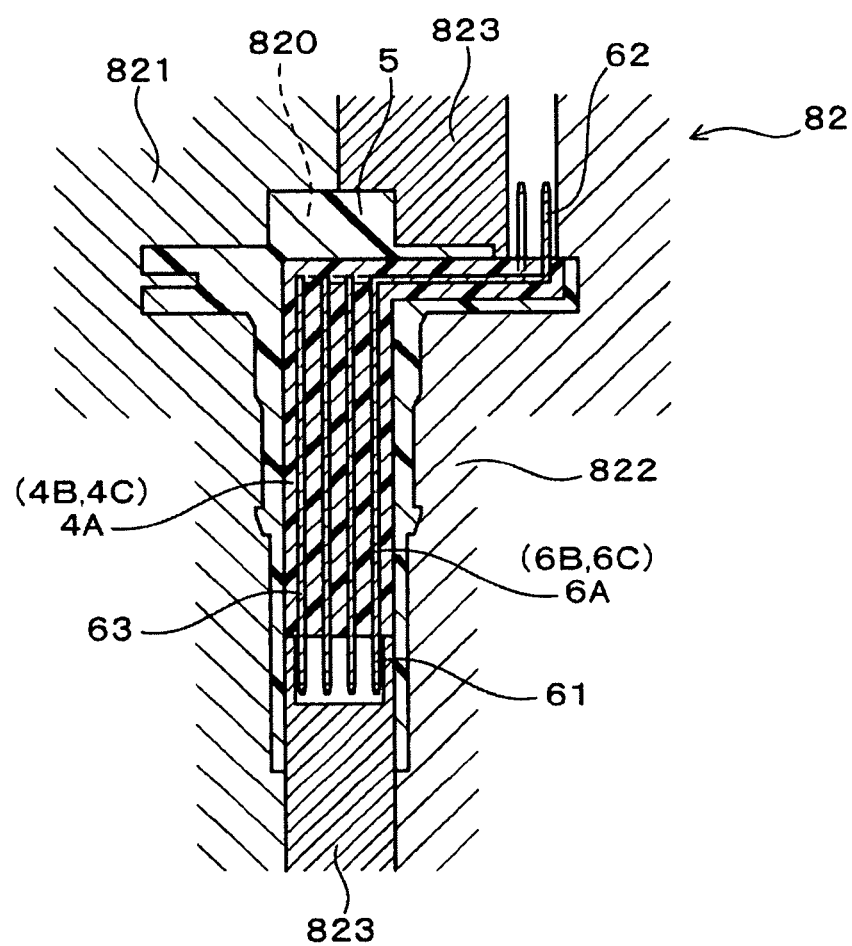
FIG. 13 is a section showing the method for manufacturing the circuit board connector according to the embodiment, schematically showing a state where an outer resin portion is molded in the mold.

Then, as shown in FIG. 13, a second resin material in a molten state for constituting the outer resin portion 5 is filled into the cavity 820 of the second mold 82. Thus, the outer resin portion 5 is molded with the second resin material, a state where the both end parts 61, 62 of the first to third connector terminals 6A, 6B and 6C project from both ends of the first to third core resin portions 4A, 4B and 4C is maintained, and the first to third core resin portions 4A, 4B and 4C are embedded in the outer resin portion 5. In this way, the outer resin portion 5 having the first to third core resin portions 4A, 4B and 4C arranged therein is insert-molded to form a second insert part 50 including the connector resin portion 3.

The second mold 82 can be constituted by two openable and closable mold parts 821, 822 and a slide mold part 823 slidable with respect to the respective mold parts 821, 822 to mold the outer resin portion 5.

Figure 14:
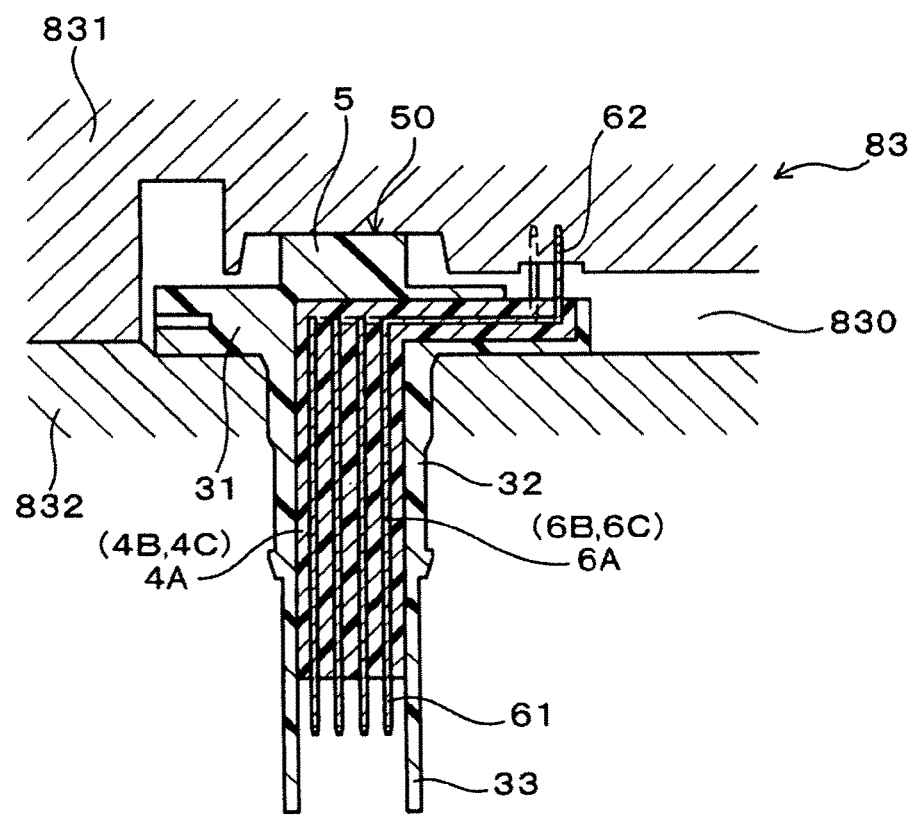
FIG. 14 is a section showing the method for manufacturing the circuit board connector according to the embodiment, schematically showing a state where an insert part including the connector resin portion is arranged in a mold.

Subsequently, as shown in FIG. 14, the second insert part 50 is arranged in the cavity 830 of the third mold 83 in the third molding step. At this time, the base 31 of the connector resin portion 3 is arranged in the cavity 830 of the third mold 83 and the tower 32 of the connector resin portion 3 is arranged outside the cavity 830 of the third mold 83.

Figure 15:
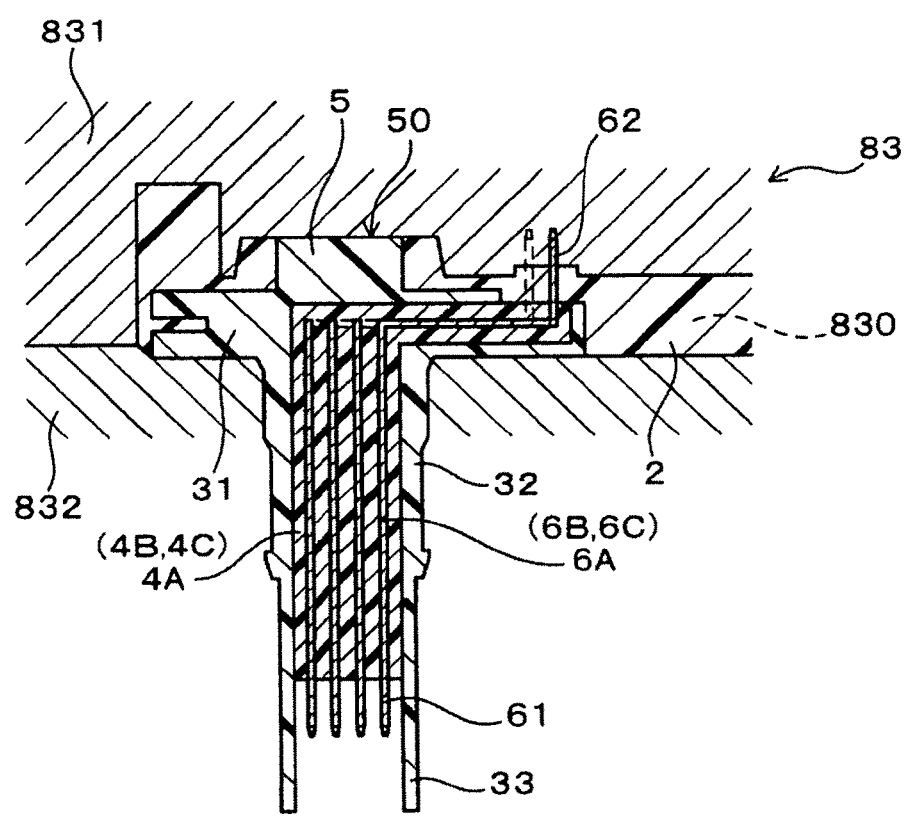
FIG. 15 is a section showing the method for manufacturing the circuit board connector according to the embodiment, schematically showing a state where the circuit board connector is molded in the mold.

Then, as shown in FIG. 15, a third resin material in a molten state for constituting the case resin portion 2 is filled into the cavity 830 of the third mold 83. Thus, the case resin portion 2 is molded with the third resin material, and the base 31 of the connector resin portion 3 and the case resin portion 2 are joined with the tower 32 of the connector resin portion 3 projecting from the case resin portion 2. In this way, the case resin portion 2 having the connector resin portion 3 arranged therein is insert-molded to mold the circuit board connector 1.

The third mold 83 can be constituted by a pair of openable and closable mold parts 831, 832 for molding the case resin portion 2.

As the second and third molding steps, the outer resin portion 5 of the connector resin portion 3 is molded separately from the case resin portion 2 before the case resin portion 2 is molded. Thus, even the circuit board connector 1 in which the tower 32 of the connector resin portion 3 projects long from the case resin portion 2 can be molded by the small-size molding apparatus.

Functions and Effects

The circuit board connector 1 of this embodiment is molded by performing molding in the first stage for the first to third core resin portions 4A, 4B and 4C having the first to third connector terminals 6A, 6B and 6C arranged therein, molding in the second stage for the outer resin portion 5 having the first to third core resin portions 4A, 4B and 4C arranged therein and molding in the third stage for the case resin portion 2 having the connector resin portion 3 arranged therein. A degree of freedom in arraying the first to third connector terminals 6A, 6B and 6C can be enhanced by molding the first to third core resin portions 4A, 4B and 4C having the first to third connector terminals 6A, 6B and 6C arranged therein.

The first to third connector terminals 6A, 6B and 6C are arrayed separately in the first to third core resin portions 4A, 4B and 4C. The first to third core resin portions 4A, 4B and 4C are formed for each stage in which the first to third connector terminals 6A, 6B, 6C are arranged, and the entire array of the first to third connector terminals 6A, 6B and 6C is formed by uniting the first to third core resin portions 4A, 4B and 4C.

Further, by molding the connector resin portion 3 having the first to third core resin portions 4A, 4B and 4C arranged therein, the structure of the molding apparatus can be simplified as compared to the case where the connector resin portion 3 and the case resin portion 2 are integrally molded. Specifically, the connector resin portion 3 includes the tower 32 projecting from the case resin portion 2. In the case of integrally molding the connector resin portion 3 and the case resin portion 2 by one molding, the outer shape of a molded article is large and a molding apparatus which molds the molded article and from which the molded article is taken out may be enlarged.

On the other hand, in the case of separately molding the connector resin portion 3 and the case resin portion 2, the molding apparatus only has to be dimensioned in conformity with the outer shape of the connector resin portion 3 and in conformity with the outer shape of the case resin portion 2. Thus, the molding apparatus can be reduced in size.

The case resin portion 2 is insert-molded in the mold 83 with the connector resin portion 3, and the third resin material constituting the case resin portion 2 is joined to the second resin material constituting the outer resin portion 5 of the connector resin portion 3 by resin molding. In this way, the circuit board connector 1 can be molded by the small molding apparatus by performing insert molding in three stages for the first to third core resin portions 4A, 4B and 4C, for the outer resin portion 5 and for the case resin portion 2.

Therefore, according to the circuit board connector 1 and the circuit board connector manufacturing method of this embodiment, molding by the small-size molding apparatus is enabled by performing insert molding in three stages.

The invention is not limited only to the above embodiment and further different embodiments can be configured without departing from the scope of the invention. Further, the invention includes various modifications and modifications within the scope of equivalents. Furthermore, combinations, forms and the like of various constituent elements envisaged from the invention also are included in the scope of the invention.

LIST OF REFERENCE SIGNS 1 circuit board connector
11 cover
111 seal
12 case
13 mating connector
2 case resin portion
20 space
21 recess
22 mounting hole
3 connector resin portion
31 base
32 tower
33 connector mounting portion
35 connector
4A, 4B, 4C core resin portion
40 first insert part
41 ventilation path
411, 412 opening
5 outer resin portion
50 second insert part
51 inflow groove
6A, 6B, 6C connector terminal
61 first end
62 second end
63 intermediate part
71 circuit board
72 electronic control component
73 automatic transmission
81 first mold 82 second mold
83 third mold
810, 820, 830 cavity

What is claimed is:

1. A circuit board connector, comprising:
a case resin portion formed from resin and having a recess with a circuit board arranged therein;
a connector resin portion formed from resin and including a base constituting a part of the case resin portion and a tower connected to the base and projecting from the case resin portion; and
connector terminals each of which has a base intermediate part, a base end part connected to the base intermediate part and electrically connected to the circuit board, a tower intermediate part projecting from the base intermediate part and a tower end part connected to the tower intermediate portion and projecting to outside,
wherein:
the connector resin portion includes:
core resin portions arranged in an inner part of the connector resin portion to cover and embed the base intermediate parts and the tower intermediate parts of the connector terminals while excluding both the base end parts and the tower end parts of the connector terminals; and
an outer resin portion arranged on an outer part of the connector resin portion to cover and embed the core resin portions, and
a resin material constituting the case resin portion is joined to a resin material constituting the outer resin portion by resin molding and the circuit board is spaced from the connector resin portion.

2. The circuit board connector of claim 1, further comprising a cover closing the recess to define an enclosed space having the circuit board therein, and the connector resin portion is formed with a ventilation path for letting a space defining the recess having the circuit board arranged therein be open to outside air.

3. The circuit board connector of claim 1, wherein the base intermediate parts of the connector terminals are aligned angularly to the tower intermediate parts of the respective connector terminals.

4. The circuit board connector of claim 1, wherein the base intermediate parts of the connector terminals are perpendicular to the tower intermediate parts of the respective connector terminals.

5. The circuit board connector of claim 1, wherein the base end part and the tower end part of the connector terminals are parallel to one another and offset from one another.

6. The circuit board connector of claim 1, wherein:
the tower projects in a direction perpendicular to a plane direction of the circuit board in the case resin portion,
a connector mounting portion on which a mating connector is mounted is formed on a tip part of the connector resin portion, and
the connector mounting portion is formed by the outer resin portion and has a tubular shape to surround the tower end parts of the connector terminals projecting from the core resin portion.

7. The circuit board connector of claim 6, wherein:
the core resin portions covering the base intermediate parts and the tower intermediate parts of the connector terminals are arranged to face each other in the outer resin portion,
the connector resin portion is formed with a ventilation path for letting a space defining the recess having the circuit board arranged therein be open to outside air, and
the ventilation path is open in a side surface of the outer resin portion constituting the tower, utilizing a groove portion formed in mating surfaces of the core resin portions facing each other.

8. The circuit board connector of claim 7, wherein a part where the case resin portion and the outer resin portion are joined is shaped to retain the outer resin portion in the case resin portion.

9. A method for manufacturing a circuit board connector, the method comprising:
providing connector terminals each of which has a base end part, a tower end part and an intermediate portion extending angularly between the base end part and the tower end part;
filling a first resin material into a first mold having the connector terminals arranged therein and performing insert molding for forming a core resin portion surrounding and engaging the intermediate portions of the connector terminals while keeping the base end parts and the tower end parts exposed;
filling a second resin material into a second mold having the core resin portion arranged therein and performing insert molding for forming an outer resin portion that at least partly surrounds and engages the core resin portion while keeping the base end parts and the tower end parts of each of the connector terminals exposed, with the core resin portion and the outer resin portion defining a connector resin portion having a base from which the base end parts of the connector terminals project and a tower projecting from the base while leaving the tower end parts of the connector terminals exposed; and
filling a third resin material into a third mold having the base of the connector resin portion arranged therein and performing insert molding for forming a case resin portion at least partly surrounding and engaging the base of the core resin portion while leaving the base end parts of the connector terminals projecting into a recess of the case resin portion for connection to a circuit board in the recess, and thereby obtaining the circuit board connector.

* * * * *